United States Patent
Chien

(10) Patent No.: US 10,371,714 B2
(45) Date of Patent: Aug. 6, 2019

(54) TEETER-TOTTER TYPE MEMS ACCELEROMETER WITH ELECTRODES ON CIRCUIT WAFER

(75) Inventor: Yu-Tsun Chien, Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 1066 days.

(21) Appl. No.: 13/523,101

(22) Filed: Jun. 14, 2012

(65) Prior Publication Data

US 2013/0333471 A1    Dec. 19, 2013

(51) Int. Cl.
*G01P 15/125* (2006.01)
*G01P 15/08* (2006.01)
*B81C 1/00* (2006.01)

(52) U.S. Cl.
CPC ........ *G01P 15/125* (2013.01); *B81C 1/00238* (2013.01); *G01P 15/0802* (2013.01); *B81B 2201/0235* (2013.01); *G01P 2015/0831* (2013.01); *G01P 2015/0837* (2013.01)

(58) Field of Classification Search
USPC ............................ 73/514.32, 514.38, 514.36
See application file for complete search history.

(56) References Cited

U.S. PATENT DOCUMENTS

| | | | |
|---|---|---|---|
| 5,719,069 A | 2/1998 | Sparks | 437/59 |
| 5,719,336 A | 2/1998 | Ando et al. | 73/514.32 |
| 5,864,063 A * | 1/1999 | Otani et al. | 73/514.32 |
| 6,405,592 B1 * | 6/2002 | Murari et al. | 73/493 |
| 6,841,992 B2 | 1/2005 | Yue et al. | 324/162 |
| 7,140,250 B2 | 11/2006 | Leonardson et al. | 73/504.14 |
| 7,146,856 B2 | 12/2006 | Malametz | 73/514.32 |
| 7,610,809 B2 * | 11/2009 | McNeil et al. | 73/514.32 |
| 7,736,931 B1 | 6/2010 | Guo | 438/52 |
| 8,100,012 B2 | 1/2012 | Martin et al. | 73/514.32 |
| 8,146,425 B2 | 4/2012 | Zhang et al. | 73/514.32 |
| 2005/0109109 A1 * | 5/2005 | Eskridge et al. | 73/514.32 |
| 2007/0164378 A1 * | 7/2007 | MacGugan | 257/416 |
| 2008/0173091 A1 * | 7/2008 | McNeil | G01P 15/125 73/514.32 |
| 2009/0145229 A1 * | 6/2009 | Gabara | 73/514.32 |

(Continued)

FOREIGN PATENT DOCUMENTS

| | | |
|---|---|---|
| EP | 0 951 068 | 10/1999 |
| EP | 1 808 405 | 7/2007 |

OTHER PUBLICATIONS

International Searching Authority, International Search Report—International Application No. PCT/US2013/045647, dated Oct. 1, 2013, together with Written Opinion of the International Searching Authority, 11 pages.

*Primary Examiner* — Xin Y Zhong
(74) *Attorney, Agent, or Firm* — Wolf, Greenfield & Sacks, P.C.

(57) ABSTRACT

In a teeter-totter type MEMS accelerometer, the teeter-totter proof mass and the bottom set of electrodes (i.e., underlying the proof mass) are formed on a device wafer, while the top set of electrodes (i.e., overlying the teeter-totter proof mass) are formed on a circuit wafer that is bonded to the device wafer such that the top set of electrodes overlie the teeter-totter proof mass. The electrodes formed on the circuit wafer may be formed from an upper metallization layer on the circuit wafer, which also may be used to form various electrical connections and/or bond pads.

20 Claims, 5 Drawing Sheets

(56) References Cited

U.S. PATENT DOCUMENTS

2010/0011860 A1* 1/2010 Offenberg ............ G01P 15/125
   73/514.32
2010/0242600 A1* 9/2010 Lin et al. .................. 73/504.12

* cited by examiner

TEETER-TOTTER TYPE MEMS ACCELEROMETER WITH ELECTRODES ON CIRCUIT WAFER

FIELD OF THE INVENTION

The present invention relates generally to a teeter-totter type MEMS accelerometer with top electrodes on a circuit wafer bonded to the MEMS device wafer.

BACKGROUND OF THE INVENTION

An accelerometer is a type of transducer that converts acceleration forces into electronic signals. Accelerometers are used in a wide variety of devices and for a wide variety of applications. For example, accelerometers are often included various automobile systems, such as for air-bag deployment and roll-over detection. Accelerometers are often also included in many computer devices, such as for motion-based sensing (e.g., drop detection) and control (e.g., motion-based control for gaming).

Generally speaking, a MEMS (Micro Electro Mechanical System) accelerometer typically includes, among other things, a proof mass and one or more sensors for sensing movement or changes in position of the proof mass induced by external accelerations. Accelerometers can be configured to sense one, two, three, or even more axes of acceleration. Typically, the proof mass is configured in a predetermined device plane, and the axes of sensitivity are generally referred to with respect to this device plane. For example, accelerations sensed along an axis parallel to the device plane are typically referred to as X or Y axis accelerations, while accelerations sensed along an axis perpendicular to the device plane are typically referred to as Z axis accelerations. A single-axis accelerometer might be configured to detect just X or Y axis accelerations or just Z axis accelerations. A two-axis accelerometer might be configured to detect X and Y axis accelerations or might be configured to detect X and Z axis accelerations. A three-axis accelerometer might be configured to detect X, Y, and Z axis accelerations.

One category of Z-axis accelerometer uses a proof mass that is configured in a "teeter-totter" or "see-saw" configuration, where the proof mass is supported from a substrate such that the proof mass rotates relative to the substrate under Z-axis acceleration. Sense electrodes placed below (e.g., on the underlying substrate) or both above and below the proof mass, which in many types of accelerometers are capacitively coupled with the proof mass, are used to sense such rotation of the proof mass and thereby to sense Z-axis acceleration. Other electrical components, such as feedback electrodes, also may be included below and/or above the proof mass. U.S. Pat. No. 7,610,809 provides an example of a differential teeter-totter type Z-axis accelerometer having electrodes both above and below the proof mass. U.S. Pat. Nos. 6,841,992 and 5,719,336 provide other examples of such teeter-totter type accelerometers. U.S. Pat. No. 8,146,425 describes a MEMS sensor with movable z-axis sensing element. Each of these patents is hereby incorporated by reference in its entirety.

FIG. 1 schematically and conceptually shows a Z-axis teeter-totter type accelerometer of the types discussed above. In this example, a device chip 102 having a Z-axis teeter-totter type accelerometer with a teeter-totter proof mass 106 and electrodes both above (110) and below (108) the teeter-totter proof mass 106 is mechanically and electrically coupled with a circuit chip 104. The teeter-totter proof mass 106 is configured to rotate about an axis 107 such that the ends of the teeter-totter proof mass 106 are movable in the Z-axis direction. The electrodes 108 and 110 form variable capacitors with the teeter-totter proof mass 106 for sensing rotation of the proof mass 106 and/or imparting forces to the proof mass 106 such as for closed-loop operation and/or self-test. While two electrodes are shown both above and below the proof mass 106 in this schematic drawing, it should be noted that additional electrodes (e.g., feedback electrodes) also may be included in the electrode layers above and/or below the proof mass 106. Thus, for example, each electrode layer may include two or more sense electrodes and one or more feedback electrodes. Various electrical and/or mechanical connections 112 are made between the device chip 102 and the circuit chip 104, such as for electrically coupling circuitry 105 in the circuit chip 104 with the top and bottom sets of electrodes 108, 110 (the electrical connections are shown as dashed lines) and the teeter-totter proof mass 106 (electrical connection not shown for convenience). The accelerometer may be operated, for example, substantially as described in U.S. Pat. No. 7,610,809 (McNeil).

From a fabrication standpoint, the three-layer structure of the accelerometer in device chip 102 (i.e., the device layer containing the teeter-totter proof mass, the electrode layers above and below the device layer, and related structures such as support structures for the proof mass and electrical connections to the proof mass and underlying electrodes) is complex. For example, if the electrode layer above the teeter-totter proof mass is fabricated in-situ with the other structures, then the fabrication process might require many additional steps in order to form the electrode layer above the teeter-totter proof mass, e.g., forming removable structures to support the proof mass, depositing and patterning various material layers on and above the proof mass in order to form the overlying electrode layer with its support structures and electrical connections, and later "releasing" the teeter-totter proof mass, e.g., by etching away one or more layers of protective material used to support and isolate the device layer components during fabrication of the overlying electrode layer. McNeil appears to address this issue by, instead, securing plates or caps to the substrate after fabrication of the device layer and the underlying electrode layer.

SUMMARY OF EXEMPLARY EMBODIMENTS

In one exemplary embodiment, a MEMS accelerometer includes a device wafer having a teeter-totter proof mass and a first plurality of electrodes in a first electrode plane underlying the teeter-totter proof mass, and also includes a circuit wafer bonded to the device wafer and including (1) a second plurality of electrodes in a second electrode plane overlying the teeter-totter proof mass and (2) circuitry coupled to the teeter-totter proof mass, the first plurality of electrodes, and the second plurality of electrodes, wherein the circuitry is configured to sense rotational movement of the proof mass caused by Z-axis accelerations via changes in capacitance between the proof mass and at least one sense electrode.

In another exemplary embodiment, a circuit wafer includes a plurality of electrodes in an electrode plane, with the electrodes arranged such that the electrodes will overlie a teeter-totter proof mass of a device wafer when the circuit wafer is bonded to the device wafer. The circuit wafer also includes circuitry electrically coupled to the plurality of electrodes and electrically couplable to a second plurality of electrodes underlying the teeter-totter proof mass and to the teeter-totter proof mass. The circuitry is configured to sense rotational movement of the proof mass caused by Z-axis accelerations via changes in capacitance between the proof mass and at least one sense electrode.

In various alternative embodiments, the electrodes on the circuit wafer are arranged to overlie the teeter-totter proof mass when the circuit wafer is flip-chip bonded to the device wafer. The electrodes on the circuit wafer may be formed from an upper metallization layer on the circuit wafer. Other components, such as at least one electrical connection between the circuit wafer and the device wafer and/or at least one bond pad (e.g., for metal-to-metal bonding of the wafers) also may be formed from the upper metallization layer on the circuit wafer.

In additional embodiments, each electrode layer may include a plurality of sense electrodes for sensing rotational movement of the proof mass by the circuitry. Such sense electrodes may be electrically coupled to the circuitry in a differential configuration. Each electrode layer additionally or alternatively may include at least one feedback electrode for imparting a force to the proof mass, in which case the circuitry may include a feedback circuit for providing electrical signals to the feedback electrodes.

Additional embodiments may be disclosed and claimed.

BRIEF DESCRIPTION OF THE DRAWINGS

The foregoing and advantages of the invention will be appreciated more fully from the following further description thereof with reference to the accompanying drawings wherein.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

In embodiments of the present invention, the teeter-totter proof mass and the bottom set of electrodes (i.e., underlying the proof mass) are formed on a device wafer, while the top set of electrodes (i.e., overlying the teeter-totter proof mass) are formed on a circuit wafer that is bonded to the device wafer such that the top set of electrodes overlie the teeter-totter proof mass. Typically, the circuit wafer is fabricated to include an upper metallization layer (e.g., from which various electrical connections, bonding structures, and/or other components are formed), and the top set of electrodes can be formed from this upper metallization layer such that the top set of electrodes are essentially free (i.e., formed with little or no additional fabrication steps) and such that, when the circuit wafer is bonded face-to-face with the device wafer (e.g., "clip-chip" bonded), the top set of electrodes overlie the teeter-totter proof mass. The resulting accelerometer is highly integrated, with both top and bottom electrodes and related circuitry in the same wafer-level package.

Figure 1:
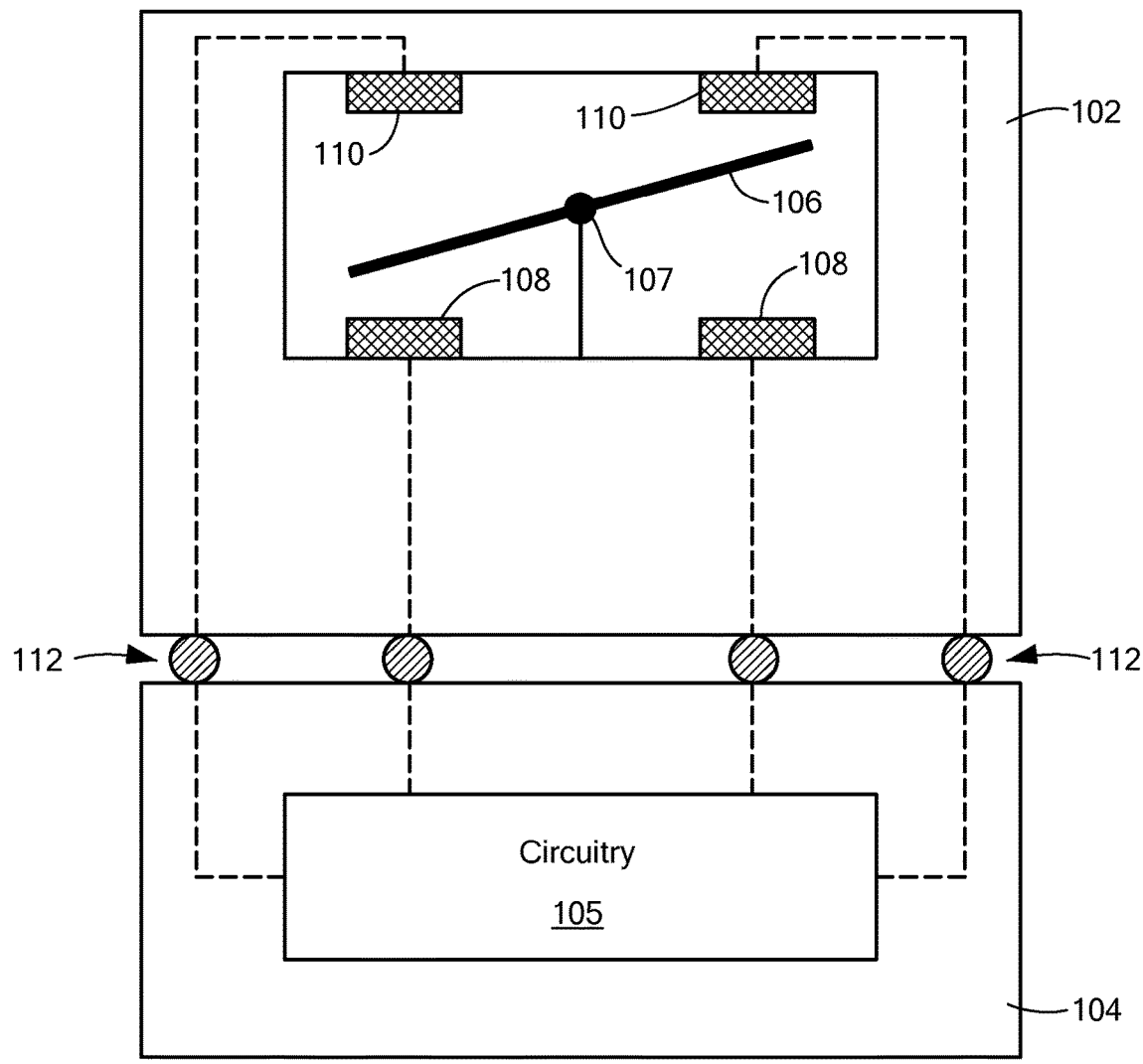
FIG. 1 schematically and conceptually shows a Z-axis teeter-totter type accelerometer of the types discussed above.
Figure 2:
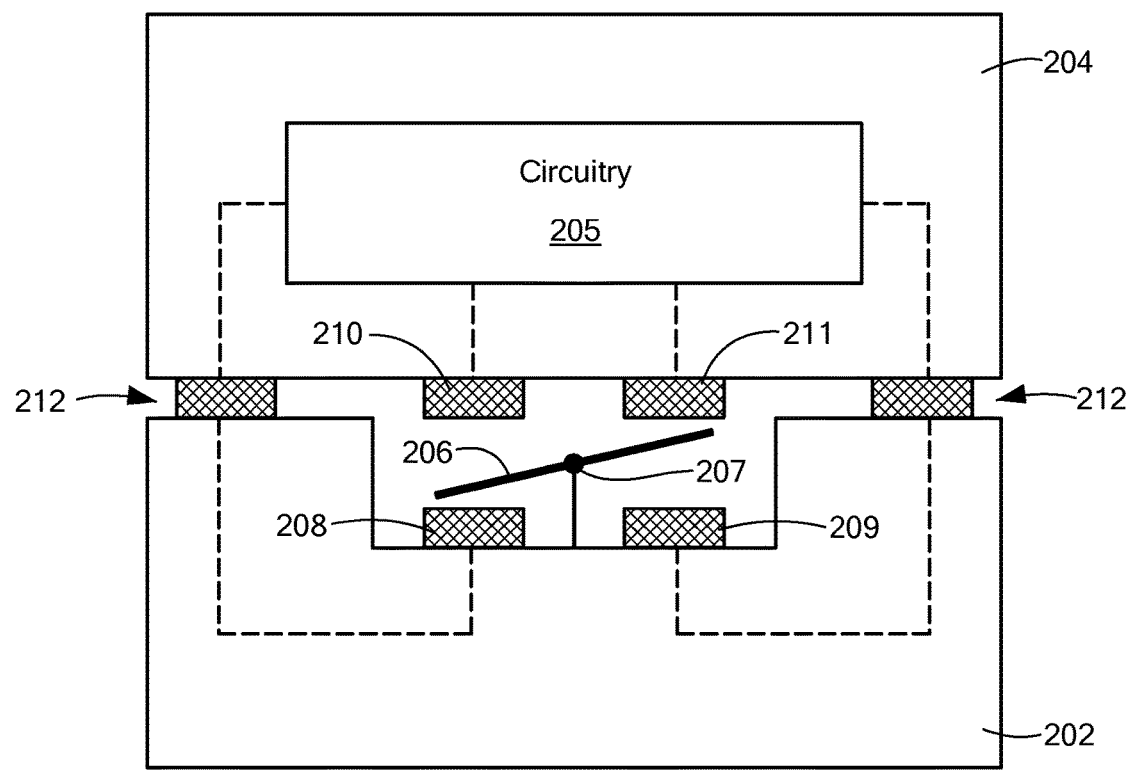
FIG. 2 schematically and conceptually shows a Z-axis teeter-totter type accelerometer in which the top set of electrodes is fabricated as part of the circuit wafer that is bonded face-to-face with the device wafer, in accordance with one exemplary embodiment.

FIG. 2 schematically and conceptually shows a Z-axis teeter-totter type accelerometer in which the top set of electrodes is fabricated as part of the circuit wafer 204 that is bonded face-to-face with the device wafer 202, in accordance with one exemplary embodiment. As discussed above, the device wafer 202 includes the teeter-totter proof mass 206 and the bottom set of electrodes (in this example, including electrodes 208 and 209), while the circuit wafer 204 includes the top set of electrodes (in this example, including electrodes 210 and 211). The teeter-totter proof mass 206 is configured to rotate about an axis 207 such that the ends of the teeter-totter proof mass 206 are movable in the Z-axis direction. The electrodes 208-211 form variable capacitors with the teeter-totter proof mass 206 for sensing rotation of the proof mass 206 and/or imparting forces to the proof mass 206 such as for closed-loop operation and/or self-test. While two electrodes are shown both above and below the proof mass 206 in this schematic drawing, it should be noted that additional electrodes (e.g., feedback electrodes) also may be included in the electrode layers above and/or below the proof mass 206. Thus, for example, each electrode layer may include two or more sense electrodes and one or more feedback electrodes. Various electrical and/or mechanical connections 212 are made between the device wafer 202 and the circuit wafer 204, such as for electrically coupling circuitry 205 in the circuit wafer 204 with the bottom set of electrodes including electrodes 208 and 209 (the electrical connections are shown as dashed lines) and the teeter-totter proof mass 206 (electrical connection not shown for convenience) on the device wafer 202. The circuitry 205 is electrically coupled to the top set of electrodes (including electrodes 210 and 211) on the circuit wafer 204 itself. The accelerometer may be operated, for example, substantially as described in U.S. Pat. No. 7,610,809 (McNeil).

Each of the electrodes (including electrodes 208-211) forms a variable capacitor with the teeter-totter proof mass. The circuitry 205 can monitor the capacitance of the various sense electrodes above and below the teeter-totter proof mass to detect rotational movement of the proof mass (e.g., due to Z-axis accelerations) and optionally also can produce forces on the proof mass by varying the voltages applied to various feedback electrodes included in certain alternative embodiments.

During operation of the accelerometer, the proof mass 206 typically rests, or is made to rest, such that it is substantially equidistant from each of the electrodes 208-211. In the presence of a Z-axis acceleration, the proof mass typically rotates in one direction of the other such that the proof mass 206 and hence the distances between the proof mass 206 and each of the electrodes 208-211 changes. For example, under certain conditions, the proof mass 206 will rotate such that the distances between the proof mass 206 and the electrodes 208, 211 decreases while the distances between the proof mass 206 and the electrodes 209, 210 increases. This is depicted in FIG. 2. Under such conditions, with electrodes 208-211 used as sense electrodes, the measured capacitances between the proof mass 206 and the electrodes 208, 211 will increase while the measured capacitances between the proof mass 206 and the electrodes 209, 210 will decrease. Under other conditions, however, the proof mass 206 will rotate such that the distances between the proof mass 206 and the electrodes 209, 210 decreases while the distances between the proof mass 206 and the electrodes 208, 211 increases. Under such conditions, with electrodes 208-211 used as sense electrodes, the measured capacitances between the proof mass 206 and the electrodes 209, 210 will increase while the measured capacitances between the proof mass 206 and the electrodes 208, 211 will decrease. With electrodes 208-211 used as sense electrodes, the circuitry 205 may sense movement of the proof mass differentially using the electrodes 208-211, e.g., according to the following relationship:

$$\Delta C = C_{208} - C_{209} + C_{211} - C_{210} \qquad \text{Eq. 1}$$

where $\Delta C$ is the differential capacitance measurement representing the relative position of the proof mass at a given time and $C_N$ is the capacitance between the proof mass and electrode N at a given time. In various alternative embodiments, Z-axis accelerations may be sensed by a measurement of the relative position of the proof mass, by monitoring the position of the proof mass in combination with applying a restorative force to the proof mass via feedback electrodes, and/or by detecting changes in the relative position of the proof mass over time.

Figure 3:
FIG. 3 schematically and conceptually shows a blank wafer/substrate on which the circuitry and the top set of electrodes can be formed.
Figure 4:
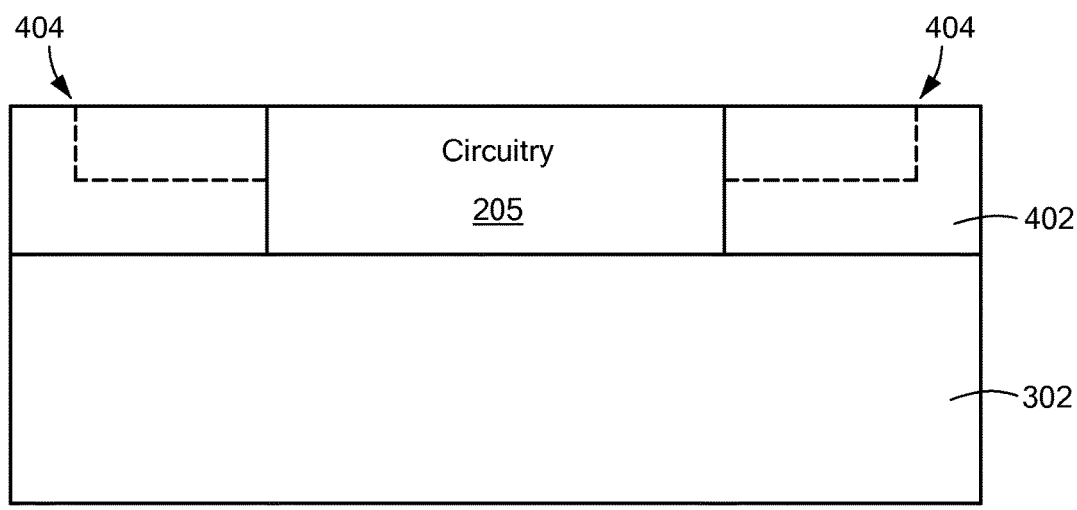
FIG. 4 schematically and conceptually shows the circuitry layer formed on the wafer of FIG. 3, including the circuitry and electrical connections for coupling with the device wafer.
Figure 5:
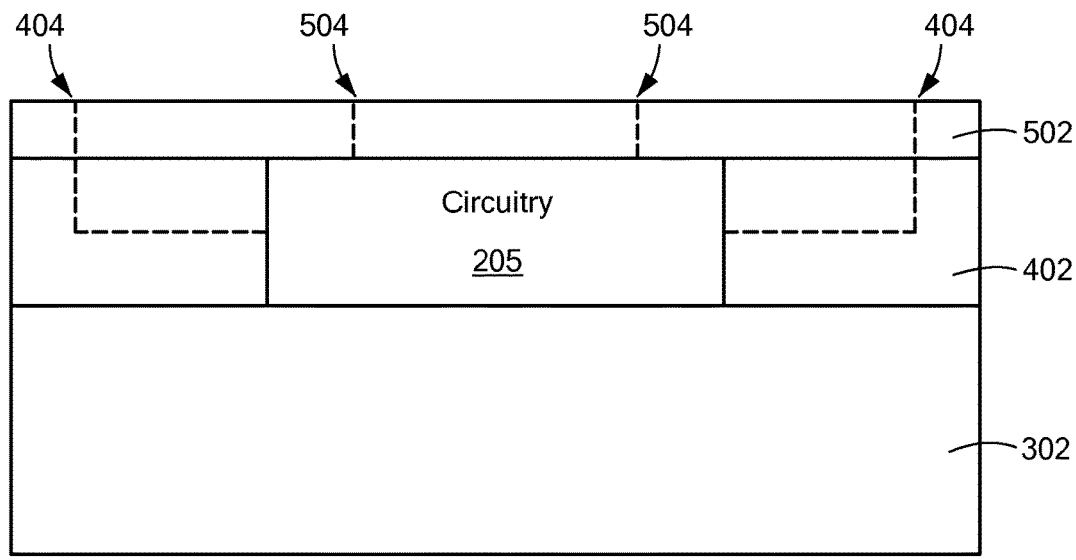
FIG. 5 schematically and conceptually shows an additional material layer (e.g., an oxide layer) through which the electrical connections are extended and through which electrical connections for the top set of electrodes are formed.
Figure 6:
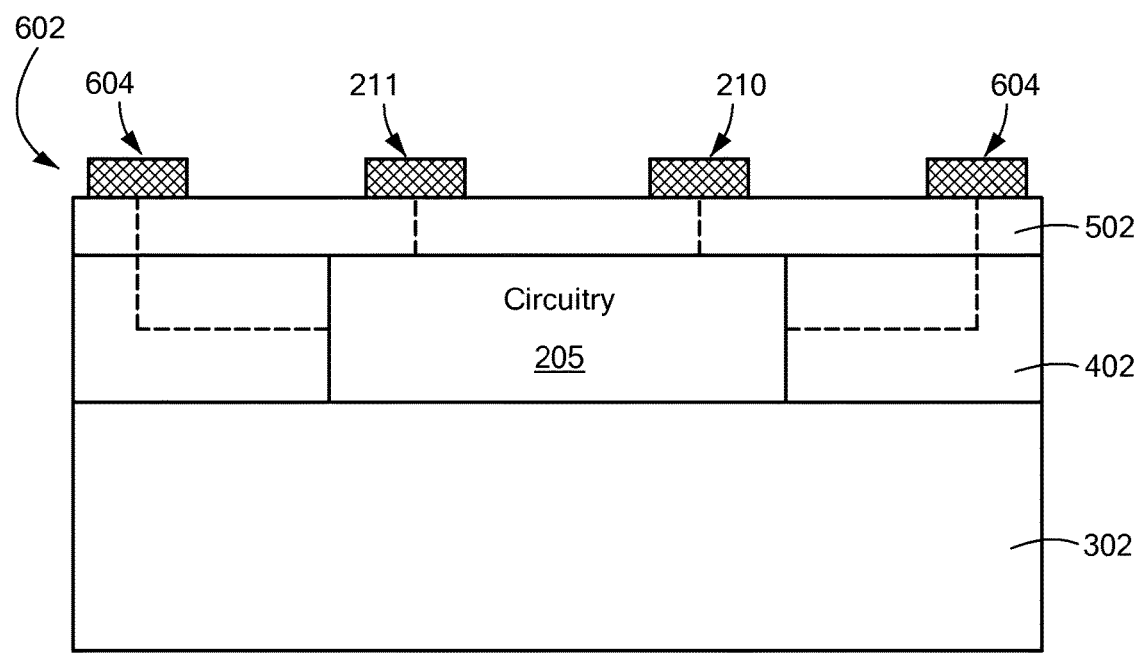
FIG. 6 schematically and conceptually shows the finalized circuit wafer including an upper metallization layer from which is formed the top set of electrodes and electrical bond pads through which the electrical connections are extended to the device wafer.

A sample fabrication process is now described schematically and conceptually with reference to FIGS. 3-6. FIG. 3 schematically and conceptually shows a blank wafer/substrate 302 on which the circuitry 205 and the top set of electrodes 210 and 211 can be formed. The blank wafer/substrate 302 may be virtually any substrate on which the circuitry and electrodes can be formed, such as, for example, a silicon wafer or the device layer of a silicon-on-insulator (SOI) wafer. FIG. 4 schematically and conceptually shows the circuitry layer 402 formed on the wafer 302, including the circuitry 205 and electrical connections 404 for coupling with the device wafer 202. FIG. 5 schematically and conceptually shows an additional material layer 502 (e.g., an oxide layer) through which the electrical connections 404 are extended and through which electrical connections 504 for the top set of electrodes 210 and 211 are formed. FIG. 6 schematically and conceptually shows the finalized circuit wafer 204 including an upper metallization layer 602 from which is formed the top set of electrodes 210 and 211 and electrical bond pads 604 through which the electrical connections 404 are extended to the device wafer 202. It should be noted that additional electrical connections may be made from the circuitry 205 on the circuit wafer 204 to components on the device wafer 202, such as for connection to the teeter-totter proof mass and/or additional electrodes (e.g., a feedback electrode, additional sense electrodes, etc.).

For convenience, many fabrication details are omitted from the figures and description. For example, formation of a particular electrical or mechanical component may involve one or more steps of depositing or otherwise forming one or more materials layers, patterning one or more material layers, etching one or more material layers, and/or other fabrication processes (e.g., annealing). The circuit wafer 204 may include various additional components, such as, for example, a non-conductive protective layer over the electrodes 210 and 211 to prevent contact with the electrodes 210 and 211 by the teeter-totter proof mass.

Figure 7:
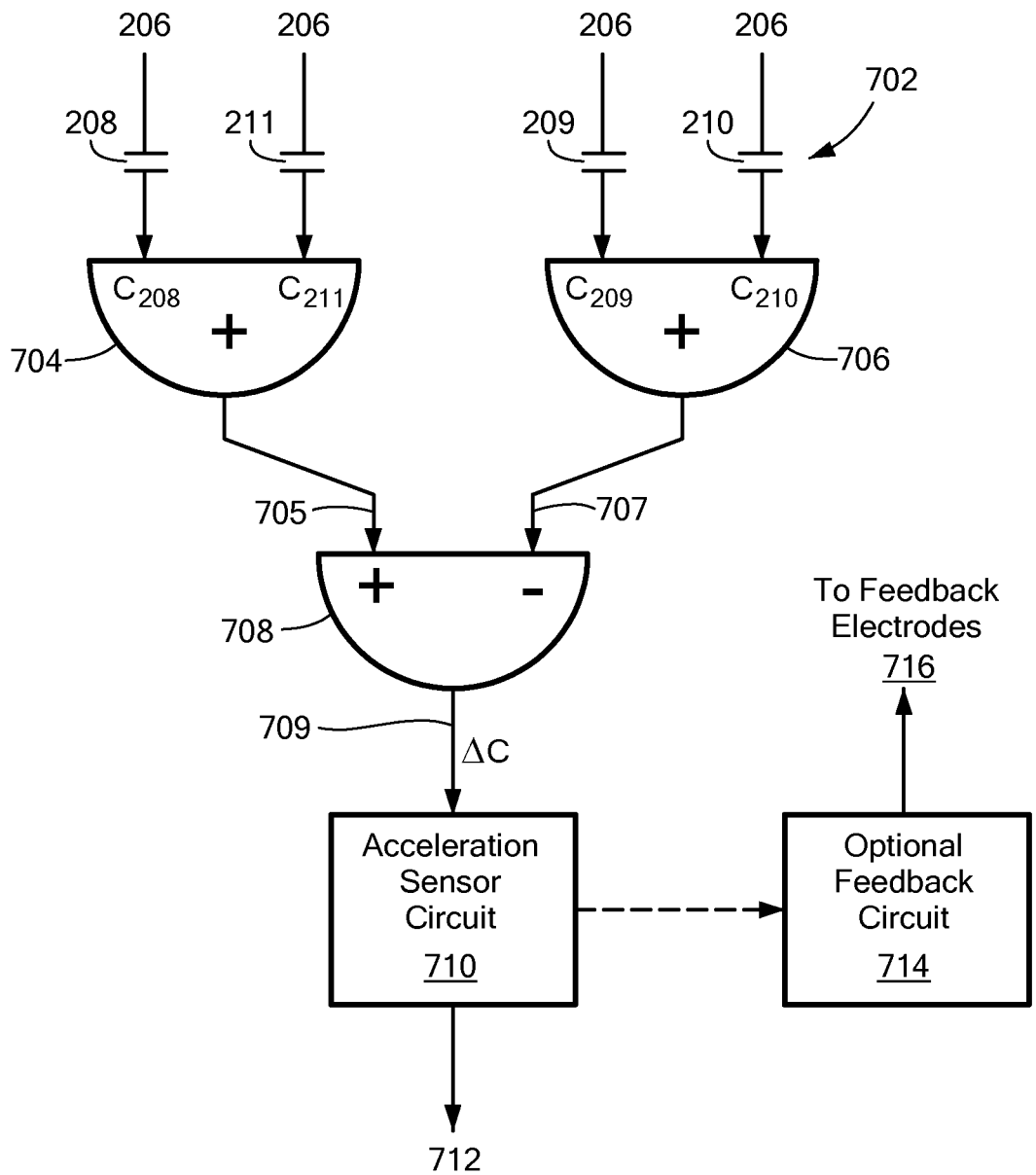
FIG. 7 schematically and conceptually shows accelerometer circuitry in accordance with an exemplary embodiment using differential sensing.

FIG. 7 schematically and conceptually shows accelerometer circuitry 205 in accordance with an exemplary embodiment using differential sensing. As discussed above, each of the sense electrodes 208-211 forms a variable capacitor with the teeter-totter proof mass 206, where reference signals (not shown for convenience) are placed on the proof mass 206 and the sense electrodes 208-211 to allow for sensing changes in capacitance due to rotational movement of the proof mass 206 due to Z-axis accelerations. These variable capacitors are represented collectively in the figure as reference numeral 702. Due to the differential nature of the sensing, variable capacitors C208 and C211 are combined at 704 to produce a common capacitance output signal 705, and variable capacitors C209 and C210 are combined at 706 to produce a common capacitance output signal 707. The signals 705 and 707 are combined at 708 to produce the differential capacitance signal 709 in accordance with Eq. 1 shown above (i.e., signal 709=signal 705−signal 707). Signal 709 is processed by an acceleration sensor circuit 710 to produce an accelerometer output signal 712, which may be output to an external processor such as in a vehicle, computer, handheld device, inertial guidance system, or other device. As discussed above, the accelerometer optionally includes various feedback electrodes, and thus, in some embodiments, the circuitry 205 includes optional feedback circuit 714 which generates feedback signals 716 to one or more feedback electrodes such as for closed-loop operation of the accelerometer and/or self-test of the accelerometer (e.g., using the feedback electrodes to produce forces on the proof mass 206 to simulate Z-axis accelerations and using the acceleration sensor circuit 710 to sense and characterize the resulting changes in capacitance via the sense electrodes 208-211.

It should be noted that arrows may be used in drawings to represent communication, transfer, or other activity involving two or more entities. Double-ended arrows generally indicate that activity may occur in both directions (e.g., a command/request in one direction with a corresponding reply back in the other direction, or peer-to-peer communications initiated by either entity), although in some situations, activity may not necessarily occur in both directions. Single-ended arrows generally indicate activity exclusively or predominantly in one direction, although it should be noted that, in certain situations, such directional activity actually may involve activities in both directions (e.g., a message from a sender to a receiver and an acknowledgement back from the receiver to the sender, or establishment of a connection prior to a transfer and termination of the connection following the transfer). Thus, the type of arrow used in a particular drawing to represent a particular activity is exemplary and should not be seen as limiting.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A MEMS accelerometer comprising:
a device wafer having a well, a teeter-totter proof mass disposed in the well, and a first plurality of electrodes in a first electrode plane underlying the teeter-totter proof mass; and
a circuit wafer bonded to the device wafer and including:
(1) a planar layer of metal patterned on a planar surface of the circuit wafer overlying the teeter-totter proof mass to define a second plurality of electrodes in-plane with a bond pad in a second electrode plane, wherein at least one of the second plurality of electrodes has an uncovered surface facing the teeter-totter proof mass; and
(2) circuitry coupled to the teeter-totter proof mass, the first plurality of electrodes, and the second plurality of electrodes, the circuitry configured to sense rotational movement of the proof mass via changes in capacitance between the proof mass and an electrode of the first plurality of electrodes or the second plurality of electrodes,
wherein each of the first and second electrode planes includes a plurality of sense electrodes for sensing rotational movement of the proof mass by the circuitry, and
wherein the sense electrodes are electrically coupled to the circuitry in a differential configuration.

2. A MEMS accelerometer according to claim 1, wherein the circuit wafer is flip-chip bonded to the device wafer.

3. A MEMS accelerometer according to claim 1, wherein a metallization layer is further patterned to define at least one electrical connection between the circuit wafer and the device wafer.

4. A MEMS accelerometer according to claim 1, wherein the circuit wafer is bonded to the device wafer via the bond pad using metal-to-metal bonding.

5. A MEMS accelerometer according to claim 1, wherein each of the first and second electrode planes further includes at least one feedback electrode for imparting a force to the teeter-totter proof mass.

6. A MEMS accelerometer according to claim 5, wherein the circuitry includes a feedback circuit for providing electrical signals to the at least one feedback electrode.

7. The MEMS accelerometer of claim 1, wherein the first plurality of electrodes comprises a first electrode and a second electrode, and wherein the second plurality of electrodes comprises a third electrode and a fourth electrode, wherein the first electrode is diagonally across from the third electrode and the second electrode is diagonally across from the fourth electrode, and wherein the circuitry comprises a first adder configured to add a sensed capacitance between the first electrode and the teeter-totter proof mass with a sensed capacitance between the teeter-totter proof mass and the third electrode.

8. A MEMS accelerometer according to claim 1, wherein the second plurality of electrodes overlie the teeter-totter proof mass.

9. A MEMS accelerometer according to claim 1, wherein the teeter-totter proof mass is attached to a bottom surface of the well.

10. A MEMS accelerometer according to claim 1, wherein the teeter-totter proof mass is configured to rotate responsive to Z-axis acceleration of the MEMS accelerometer.

11. A MEMS accelerometer according to claim 1, wherein the teeter-totter proof mass is equidistant from each of the first and second pluralities of electrodes.

12. A circuit wafer for a MEMS accelerometer, the circuit wafer comprising:
an upper metallization layer patterned, on a planar surface of the circuit wafer located to overlie a teeter-totter proof mass, to define a first plurality of electrodes in-plane with a bond pad in an electrode plane, the first plurality of electrodes arranged such that they will overlie the teeter-totter proof mass of a device wafer when the circuit wafer is bonded to the device wafer having a second plurality of electrodes underlying the teeter-totter proof mass; and
circuitry electrically coupled to the first plurality of electrodes and electrically couplable to the second plurality of electrodes and to the teeter-totter proof mass, the circuitry configured to sense rotational movement of the proof mass caused by Z-axis accelerations via changes in capacitance between the proof mass and at least one sense electrode,
wherein the at least one sense electrode is an electrode of the first plurality of electrodes, and
wherein the at least one sense electrode and the bond pad are electrically coupled to the circuitry in a differential configuration.

13. A circuit wafer according to claim 12, wherein the first plurality of electrodes are arranged to overlie the teeter-totter proof mass when the circuit wafer is flip-chip bonded to the device wafer.

14. A circuit wafer according to claim 12, wherein the upper metallization layer is further patterned to define at least one electrical connection between the circuit wafer and the device wafer.

15. A circuit wafer according to claim 12, wherein the circuitry is disposed beneath the first plurality of electrodes in the circuit wafer.

16. A circuit wafer according to claim 12, wherein the circuit wafer is bondable to the device wafer via the bond pad using metal-to-metal bonding.

17. A circuit wafer according to claim 12, wherein the first plurality of electrodes further includes at least one feedback electrode for imparting a force to the proof mass.

18. A circuit wafer according to claim 17, wherein the circuitry includes a feedback circuit for providing electrical signals to the at least one feedback electrode.

19. A circuit wafer according to claim 12, further comprising an oxide layer separating the first plurality of electrodes from the circuitry.

20. A circuit wafer according to claim 19, wherein the circuitry is electrically coupled to the first plurality of electrodes via electrical connections extending through the oxide layer.

* * * * *